(12) United States Patent
Chien et al.

(10) Patent No.: US 9,627,528 B2
(45) Date of Patent: Apr. 18, 2017

(54) SEMICONDUCTOR DEVICE HAVING GATE STRUCTURES AND MANUFACTURING METHOD THEREOF

(71) Applicant: Macronix International Co., Ltd., Hsinchu (TW)

(72) Inventors: Yu-Chin Chien, Taipei (TW); Ching-Lin Chan, Huwei Township (TW); Cheng-Chi Lin, Toucheng Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/851,018

(22) Filed: Sep. 11, 2015

(65) Prior Publication Data

US 2017/0077293 A1    Mar. 16, 2017

(51) Int. Cl.
  *H01L 29/78*   (2006.01)
  *H01L 29/66*   (2006.01)
  *H01L 29/739*  (2006.01)
  *H01L 29/861*  (2006.01)

(52) U.S. Cl.
  CPC .... *H01L 29/7816* (2013.01); *H01L 29/66681* (2013.01); *H01L 29/7393* (2013.01); *H01L 29/7831* (2013.01); *H01L 29/861* (2013.01)

(58) Field of Classification Search
  CPC ...................... H01L 29/66681; H01L 29/7816
  See application file for complete search history.

(56) References Cited

U.S. PATENT DOCUMENTS

| 6,362,036 | B1 * | 3/2002 | Chiozzi | H01L 27/0251 257/E29.013 |
| 9,041,142 | B2 * | 5/2015 | Tsai | H01L 29/7393 257/476 |
| 2011/0163376 | A1 * | 7/2011 | Cheng | H01L 27/088 257/337 |
| 2012/0018804 | A1 * | 1/2012 | Khemka | H01L 29/1083 257/337 |
| 2012/0275072 | A1 * | 11/2012 | Chen | H01L 27/0262 361/56 |
| 2013/0221404 | A1 * | 8/2013 | Chan | H01L 29/861 257/140 |
| 2013/0228831 | A1 * | 9/2013 | Chin | H01L 29/401 257/288 |

(Continued)

FOREIGN PATENT DOCUMENTS

| CN | 104900691 | 9/2015 |
| TW | 201347182 | 11/2013 |

*Primary Examiner* — Benjamin Sandvik
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and disposed in the substrate, a high-voltage doped region having the first conductivity type and disposed in the high-voltage well, a drain region disposed in the high-voltage well and spaced apart from the high-voltage doped region, a source region disposed in the high-voltage doped region, a first gate structure disposed above a first side portion of the high-voltage doped region between the source region and the drain region, and a second gate structure disposed above a second and opposite side portion of the high-voltage doped region.

19 Claims, 15 Drawing Sheets

(56) References Cited

U.S. PATENT DOCUMENTS

| | | | | |
|---|---|---|---|---|
| 2013/0265102 A1* | 10/2013 | Lin | ............... | H01L 29/808 327/530 |
| 2014/0027849 A1* | 1/2014 | Yang | ............... | H01L 29/402 257/343 |
| 2016/0300903 A1 | 10/2016 | Chien et al. | | |

* cited by examiner

US 9,627,528 B2

SEMICONDUCTOR DEVICE HAVING GATE STRUCTURES AND MANUFACTURING METHOD THEREOF

FIELD OF THE DISCLOSURE

The present disclosure relates to a semiconductor device and, more particularly, to a semiconductor device having gate structures and a manufacturing method thereof.

BACKGROUND

Ultra-high voltage semiconductor devices are widely used in display devices, portable devices, and many other applications. Design goals of the ultra-high voltage semiconductor devices include high breakdown voltage, low specific on-resistance, and high reliability in both room temperature and high temperature environments. However, as the dimensions of ultra-high voltage semiconductor devices scale down, it becomes challenging to achieve these design goals.

SUMMARY

According to an embodiment of the disclosure, a semiconductor device includes a substrate having a first conductivity type, a high-voltage well having a second conductivity type and disposed in the substrate, a high-voltage doped region having the first conductivity type and disposed in the high-voltage well, a drain region disposed in the high-voltage well and spaced apart from the high-voltage doped region, a source region disposed in the high-voltage doped region, a first gate structure disposed above a first side portion of the high-voltage doped region between the source region and the drain region, and a second gate structure disposed above a second and opposite side portion of the high-voltage doped region.

According to another embodiment of the disclosure, a method for manufacturing a semiconductor device includes providing a substrate having a first conductivity type, forming a high-voltage well having a second conductivity type in the substrate, forming a high-voltage doped region having the first conductivity type in the high-voltage well, forming a drain region in the high-voltage well and spaced apart from the high-voltage doped region, forming a source region in the high-voltage doped region, forming a first gate structure above a first side portion of the high-voltage doped region between the source region and the drain region, and forming a second gate structure above a second and opposite side portion of the high-voltage doped region.

The accompanying drawings, which are incorporated in and constitute a part of this specification, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1A:
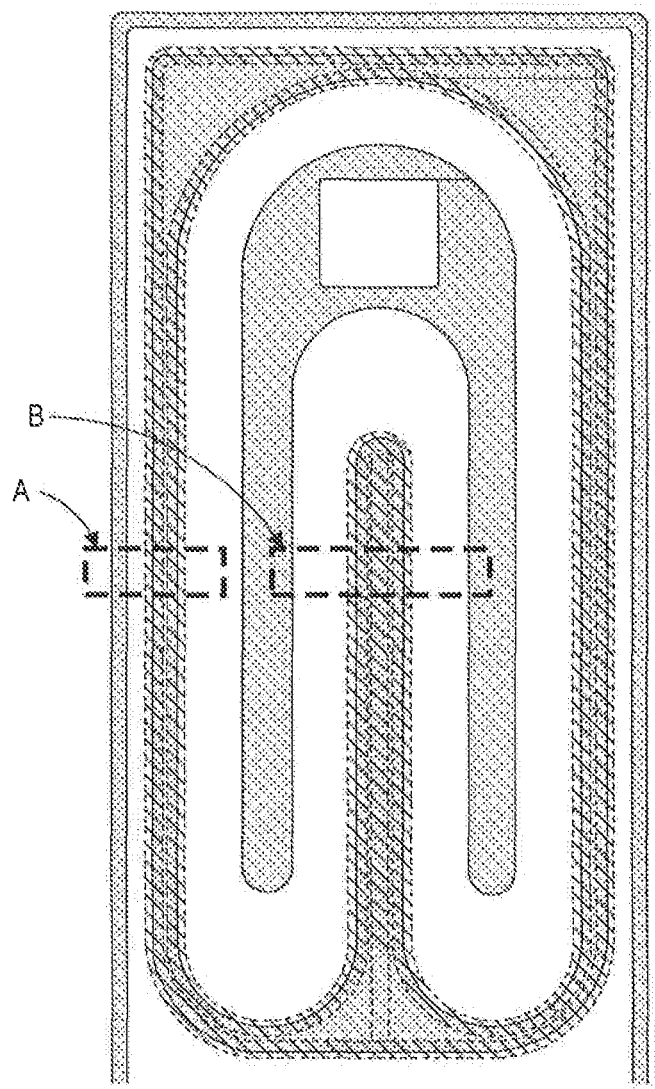
FIG. 1A is a top view of a semiconductor device, according to an illustrated embodiment.
Figure 1B:
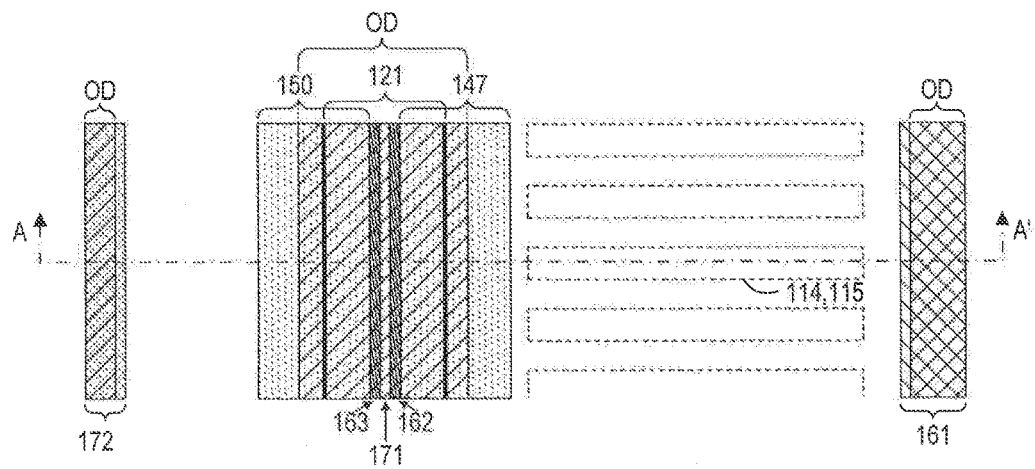
FIG. 1B is an enlarged top view of region A of the device of FIG. 1A.
Figure 1C:
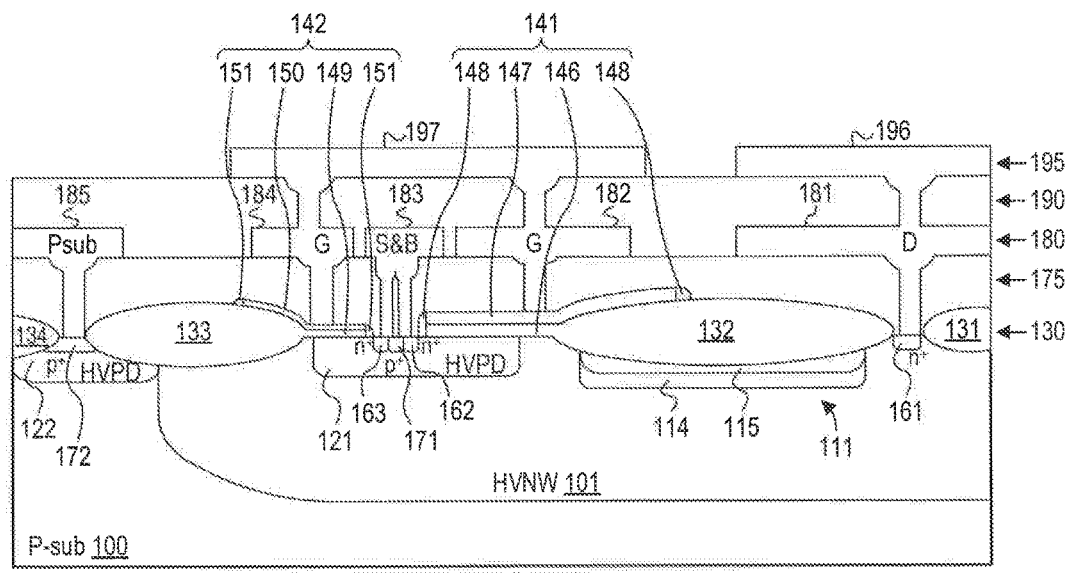
FIG. 1C is a cross-sectional view of region A of the device of FIG. 1A, along section line A-A' of FIG. 1B.
Figure 1D:
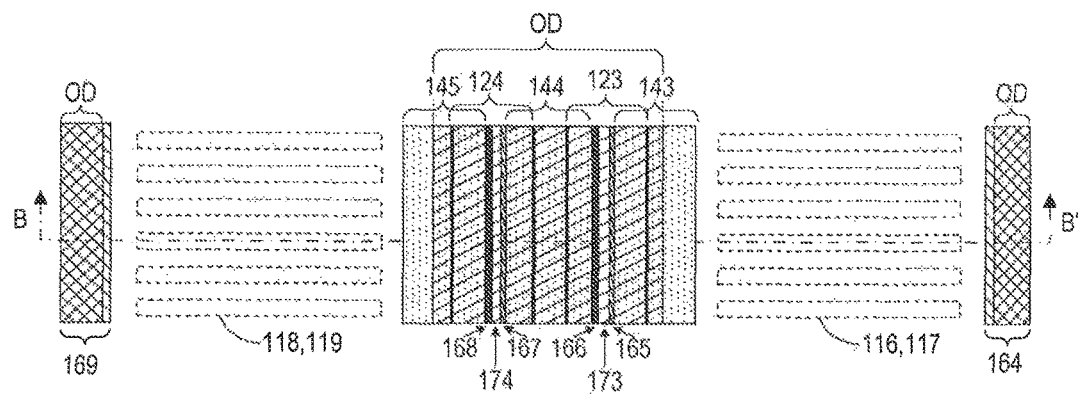
FIG. 1D is an enlarged top view of region B of the device of FIG. 1A.
Figure 1E:
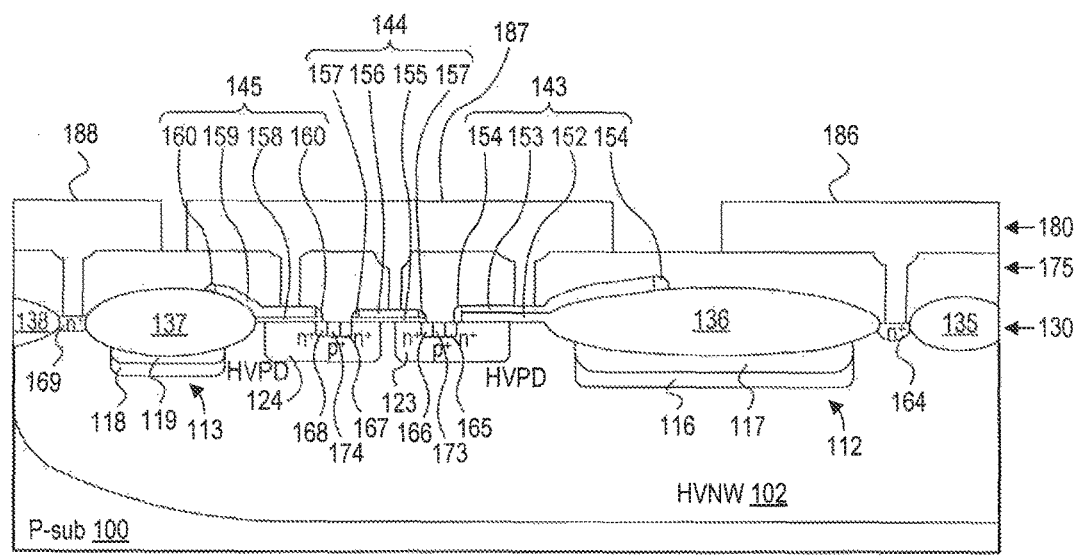
FIG. 1E is a cross-sectional view of region B of the device of FIG. 1A, along section line B-B' of FIG. 1D.

FIGS. 1A-1C illustrate a semiconductor device 10, according to an illustrated embodiment of the disclosure. FIG. 1A is a top view of device 10, illustrating only a polysilicon layer and oxide defined (OD) areas where no field oxide layer is formed. FIG. 1B is an enlarged top view of region A of device 10. FIG. 1C is a cross-sectional view of region A of device 10, along section line A-A' of FIG. 1B. FIG. 1D is an enlarged top view of region B of device 10. FIG. 1E is a cross-sectional view of region B of device 10, along section line B-B' of FIG. 1D.

Referring to FIGS. 1A-1C, device 10 includes a P-type substrate (P-sub) 100. Substrate 100 can be formed of a P-type bulk silicon material, a P-type epitaxial layer, or a P-type silicon-on-insulator (SOI) material. A first high-voltage N-well (HVNW) 101 is disposed in region A of substrate 100.

Referring to FIGS. 1A, 1D, and 1E, a second HVNW 102 is disposed in region B of substrate 100. First HVNW 101 and second HVNW 102 can be physically and electrically connected to each other. In some embodiments, first HVNW 101 and second HVNW 102 are formed as a continuous region.

Referring to FIGS. 1A-1C, a first drift region 111 is disposed in first HVNW 101 and spaced apart from a left-side edge of first HVNW 101, as viewed in FIGS. 1A-1C. First drift region 111 includes a first P-top region 114 and a first N-grade region 115 formed above first P-top region 114.

Referring to FIGS. 1A, 1D, and 1E, a second drift region 112 is disposed in second HVNW 102. A third drift region 113 is disposed in second HVNW 102 and spaced apart from a left-side edge of second drift region 112, as viewed in FIGS. 1D and 1E. Second drift region 112 includes a second P-top region 116 and a second N-grade region 117 formed above second P-top region 116. Third drift region 113 includes a third P-top region 118 and a third N-grade region 119 formed above third P-top region 118.

Referring to FIGS. 1A-1C, a first high-voltage P-doped region (HVPD) 121 is disposed in first HVNW 101, between the left-side edge of first HVNW 101 and first drift region 111, as viewed in FIGS. 1A-1C. A second HVPD 122 is disposed in substrate 100, outside of first HVNW 101, and adjacent to the left-side edge of first HVNW 101.

Referring to FIGS. 1A, 1D, and 1E, a third HVPD 123 is disposed in second HVNW 102, between second drift region 112 and third drift region 113, and spaced apart from a left-side edge of second drift region 112, as viewed in FIGS. 1D and 1E. A fourth HVPD 124 is disposed in second HVNW 102, between third HVPD 123 and third drift region 113, and spaced apart from a left-side edge of third HVPD 123.

Referring to FIGS. 1A-1C, a field oxide (FOX) layer 130 is disposed above substrate 100. FOX layer 130 includes a first FOX portion 131 overlapping a right portion of first HVNW 101, a second FOX portion 132 overlapping first drift region 111, a third FOX portion 133 overlapping a left-side portion of first HVNW 101 and a right-side portion of second HVPD 122, and a fourth FOX portion 134 overlapping a left-side portion of second HVPD 122.

Referring to FIGS. 1A, 1D, and 1E, FOX layer 130 further includes a fifth FOX portion 135 overlapping a right portion of second HVNW 102, a sixth FOX portion 136 overlapping second drift region 112, a seventh FOX portion 137 overlapping third drift region 113, and an eighth FOX portion 138 overlapping a left portion of second HVNW 102.

Referring to FIGS. 1A-1C, first and second gate structures 141 and 142 are disposed above region A of substrate 100. First gate structure 141 overlaps a left-side portion of second FOX portion 132, a region of first HVNW 101 between second FOX portion 132 and first HVPD 121, and a right-side portion of first HVPD 121. First gate structure 141 includes a first gate oxide layer 146, a first gate layer 147, and first spacers 148. First gate oxide layer 146 is disposed above substrate 100, and overlaps the region of first HVNW 101 between second FOX portion 132 and first HVPD 121, and the right-side portion of first HVPD 121. First gate layer 147 is disposed above first gate oxide layer 146, and overlaps the left-side portion of second FOX portion 132, the region of first HVNW 101 between second FOX portion 132 and first HVPD 121, and the right-side portion of first HVPD 121. First spacers 148 are disposed on both side walls of first gate layer 147, and a left-side side wall of first gate oxide layer 146.

Second gate structure 142 overlaps a left-side portion of first HVPD 121, a region of first HVNW 101 between first HVPD 121 and third FOX portion 133, and a right-side portion of third FOX portion 133. Second gate structure 142 includes a second gate oxide layer 149, a second gate layer 150, and second spacers 151. Second gate oxide layer 149 is disposed above substrate 100, and overlaps the left-side portion of first HVPD 121, and the region of first HVNW 101 between first HVPD 121 and third FOX portion 133. Second gate layer 150 is disposed above second gate oxide layer 149, and overlaps the left-side portion of first HVPD 121, the region of first HVNW 101 between first HVPD 121 and third FOX portion 133, and the right-side portion of third FOX portion 133. Second spacers 151 are disposed on both side walls of second gate layer 150, and a right-side side wall of second gate oxide layer 149.

The thickness of first gate oxide layer 146 and the thickness of second gate oxide layer 149 are variable based on the structure and application of device 10. In one embodiment, the thickness of first gate oxide layer 146 is greater than the thickness of second gate oxide layer 149.

Referring to FIGS. 1A, 1D, and 1E, third through fifth gate structures 143 through 145 are disposed above region B of substrate 100. Third gate structure 143 overlaps a left-side portion of sixth FOX portion 136, a region of second HVNW 102 between third HVPD 123 and sixth FOX portion 136, and a right-side portion of third HVPD 123. Third gate structure 143 includes a third gate oxide layer 152, a third gate layer 153, and third spacers 154. Third gate oxide layer 152 is disposed above substrate 100, and overlaps the region of second HVNW 102 between third HVPD 123 and sixth FOX portion 136, and the right-side portion of third HVPD 123. Third gate layer 153 is disposed above third gate oxide layer 152, and overlaps the left-side portion of sixth FOX portion 136, the region of second HVNW 102 between third HVPD 123 and sixth FOX portion 136, and the right-side portion of third HVPD 123. Third spacers 154 are disposed on both side walls of third gate layer 153, and a left-side side wall of third gate oxide layer 152.

Fourth gate structure 144 overlaps a left-side portion of third HVPD 123, a region of second HVNW 102 between third HVPD 123 and fourth HVPD 124, and a right-side portion of fourth HVPD 124. Fourth gate structure 144 includes a fourth gate oxide layer 155, a fourth gate layer 156, and fourth spacers 157. Both of fourth gate oxide layer 155 and fourth gate layer 156 overlap the left-side portion of third HVPD 123, the region of second HVNW 102 between third HVPD 123 and fourth HVPD 124, and the right-side portion of fourth HVPD 124. Fourth spacers 157 are disposed on both side walls of fourth gate oxide layer 155 and both side walls of fourth gate layer 156.

Fifth gate structure 145 overlaps a left-side portion of fourth HVPD 124, a region of second HVNW 102 between fourth HVPD 124 and seventh FOX portion 137, and a right-side portion of seventh FOX portion 137. Fifth gate structure 145 includes a fifth gate oxide layer 158, a fifth gate layer 159, and fifth spacers 160. Fifth gate oxide layer 158 is disposed over substrate 100, and overlaps the left-side portion of fourth HVPD 124, and the region of second HVNW 102 between fourth HVPD 124 and seventh FOX portion 137. Fifth gate layer 159 is disposed above fifth gate oxide layer 158, and overlaps the left-side portion of fourth HVPD 124, the region of second HVNW 102 between fourth HVPD 124 and seventh FOX portion 137, and the right-side portion of seventh FOX portion 137. Fifth spacers 160 are disposed on both side walls of fifth gate layer 159, and a right-side side wall of fifth gate oxide layer 158.

Referring to FIGS. 1A-1C, first through third $N^+$-regions 161-163 are disposed in region A of substrate 100. First $N^+$-region 161 is disposed in first HVNW 101 and between first FOX portion 131 and second FOX portion 132. Second $N^+$-region 162 is disposed in first HVPD 121 and adjacent to a left-side edge of first gate structure 141. Third $N^+$-region 163 is disposed in first HVPD 121 and adjacent to a right-side edge of second gate structure 142. Second $N^+$-region 162 and third $N^+$-region 163 are spaced apart from each other.

Referring to FIGS. 1A, 1D, and 1E, fourth through ninth $N^+$-regions 164-169 are disposed in region B of substrate 100. Fourth $N^+$-region 164 is disposed in second HVNW 102, and between fifth FOX portion 135 and sixth FOX portion 136. Fifth $N^+$-region 165 is disposed in third HVPD 123, and adjacent to a left-side edge of third gate structure 143. Sixth $N^+$-region 166 is disposed in third HVPD 123, and adjacent to a right-side edge of fourth gate structure 144. Fifth $N^+$-region 165 and sixth $N^+$-region 166 are spaced apart from each other. Seventh $N^+$-region 167 is disposed in fourth HVPD 124, and adjacent to a left-side edge of fourth gate structure 144. Eighth $N^+$-region 168 is disposed in fourth HVPD 124, and adjacent to a right-side edge of fifth gate structure 145. Seventh N+-region 167 and eighth N+-region 168 are spaced apart from each other. Ninth N+-region 169 is disposed in second HVNW 102, and adjacent to and between seventh FOX portion 137 and eighth FOX portion 138.

Referring to FIGS. 1A-1C, first and second P+-regions 171 and 172 are disposed in region A of substrate 100. First P+-region 171 is disposed in first HVPD 121, adjacent to and between second N+-region 162 and third N+-region 163. Second P+-region 172 is disposed in second HVPD 122 and between third FOX portion 133 and fourth FOX portion 134. Second P+-region 172 constitutes a contact region for making conductive contact to substrate 100 of device 10.

Referring to FIGS. 1A, 1D, and 1E, third and fourth P+-regions 173 and 174 are disposed in region B of substrate 100. Third P+-region 173 is disposed in third HVPD 123, adjacent to and between fifth N+-region 165 and sixth N+-region 166. Fourth P+-region 174 is disposed in fourth HVPD 174, adjacent to and between seventh N+-region 167 and eighth N+-region 168.

Referring to FIGS. 1A-1E, an interlayer dielectric (ILD) layer 175 is disposed over substrate 100. ILD layer 175 includes a plurality of through holes for exposing various regions of substrate 100.

A first contact layer 180 provided, for example, as a metal layer, is disposed over ILD layer 175. Hereinafter, first contact layer 180 is referred to as M1 layer 180. Referring to FIGS. 1A-1C, M1 layer 180 includes first through fifth M1 portions 181-185 in region A. First M1 portion 181 conductively contacts first N+-region 161, and is connectable to receive a drain voltage. Second M1 portion 182 conductively contacts first gate layer 147, and is connectable to receive a gate voltage. Third M1 portion 183 conductively contacts second N+-region 162, first P+-region 171, and third N+-region 163, and is connectable to receive a source voltage. Fourth M1 portion 184 conductively contacts second gate layer 150, and is connectable to receive the same gate voltage received by second M1 portion 182. Fifth M1 portion 185 conductively contacts second P+-region 172, and is connectable to receive a voltage to be applied to substrate 100 of device 10.

Referring FIGS. 1A, 1D, and 1E, M1 layer 180 further includes sixth through eighth M1 portions 186-188 in region B. Sixth M1 portion 186 conductively contacts fourth N+-region 164. Seventh M1 portion 187 conductively contacts third through fifth gate structures 143-145. Eighth M1 portion 188 conductively contacts ninth N+-region 169.

Referring to FIGS. 1A-1C, an inter-metal dielectric (IMD) layer 190 is disposed over M1 layer 180. IMD layer 190 includes through holes respectively corresponding to first M1 portion 181, second M1 portion 182, fourth M1 portion 184, and fifth M1 portion 185.

A second contact layer 195 provided, for example, as a metal layer, is disposed over IMD layer 190. Hereinafter, second contact layer 195 is referred to as M2 layer 195. M2 layer 195 includes first and second M2 portions 196 and 197, respectively, in region A. First M2 portion 196 conductively contacts first M1 portion 181. Second M2 portion 197 conductively contacts second M1 portion 182 and fourth M1 portion 184. Additional isolating layers and contact layers can be disposed above substrate 100. Although not illustrated in FIG. 1E, an IMD layer and a contact layer can be disposed on region B of device 10, i.e., the structure illustrated in FIG. 1E.

The structure formed in region A of device 10 includes a first N-type metal oxide semiconductor (NMOS) device and a second NMOS device. The first NMOS device includes a drain region constituted by first N+-region 161, first gate structure 141, and a source region constituted by second N+-region 162, first P+-region 171, and third N+-region 163. The second NMOS device includes a drain region constituted by first N+-region 161, second gate structure 142, and a source region constituted by second N+-region 162, first P+-region 171, and third N+-region 163. The second NMOS device provides a drain current in addition to the drain current of the first NMOS device, thus increasing the total drain current of device 10, and decreasing the specific on-resistance of device 10.

The structure formed in region B of device 10 includes a third NMOS device, a fourth NMOS device, and a fifth NMOS device. The third NMOS device includes a drain region constituted by fourth N+-region 164, third gate structure 143, and a source region constituted by fifth N+-region 165, third P+-region 173, and sixth N+-region 166. The fourth NMOS device includes a drain region constituted by fifth N+-region 165, third P+-region 173, and sixth N+-region 166, fourth gate structure 144, and a source region constituted by seventh N+-region 167, fourth P+-region 174, and eighth N+-region 168. The fifth NMOS device includes a drain region constituted by fourth N+-region 164, fifth gate structure 145, and a source region constituted by seventh N+-region 167, fourth P+-region 174, and eighth N+-region 168.

Figure 2A:
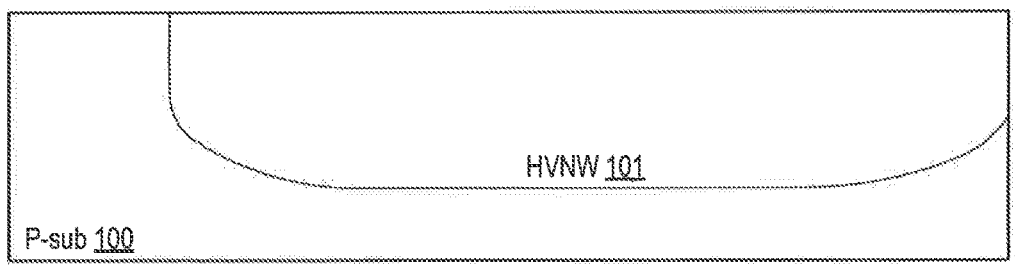
FIGS. 2A-2N schematically illustrate a process of forming region A of the device of FIGS. 1A-1C, according to an illustrated embodiment.
Figure 2B:
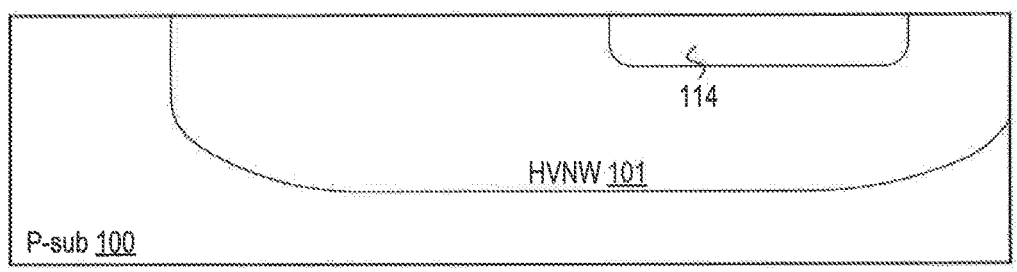
Figure 2C:
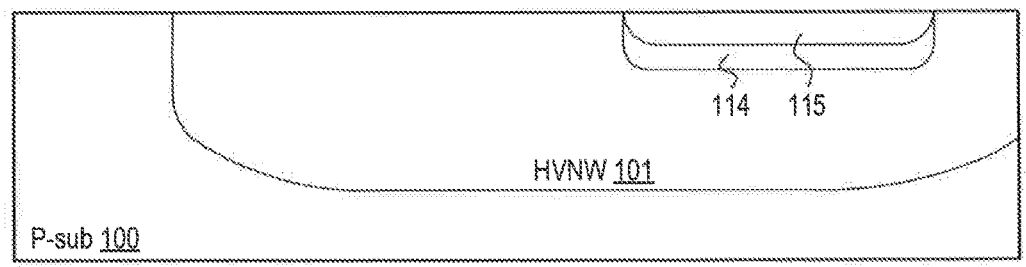
Figure 2D:
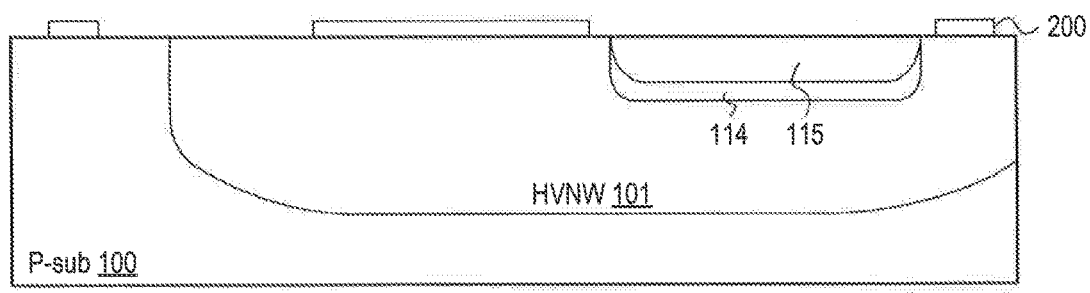
Figure 2E:
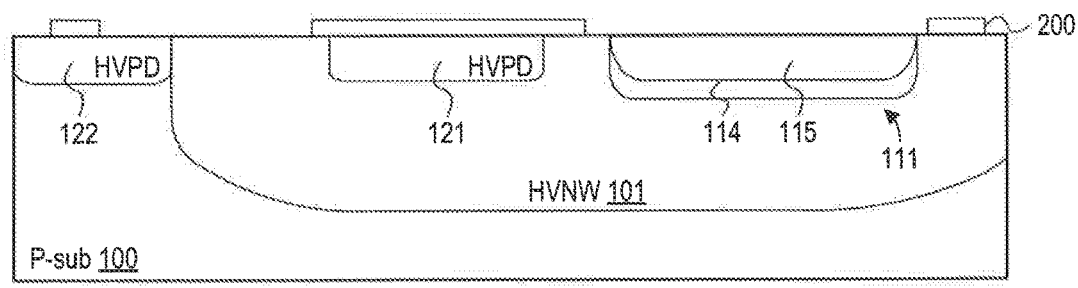
Figure 2F:
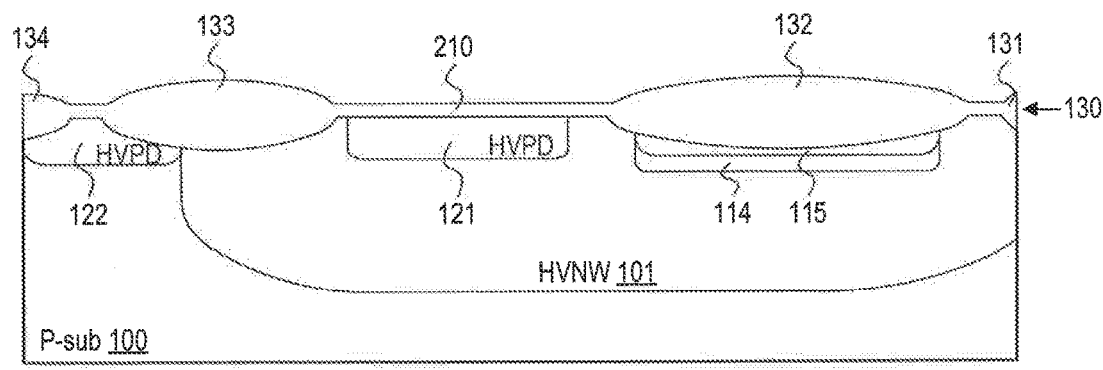
Figure 2G:
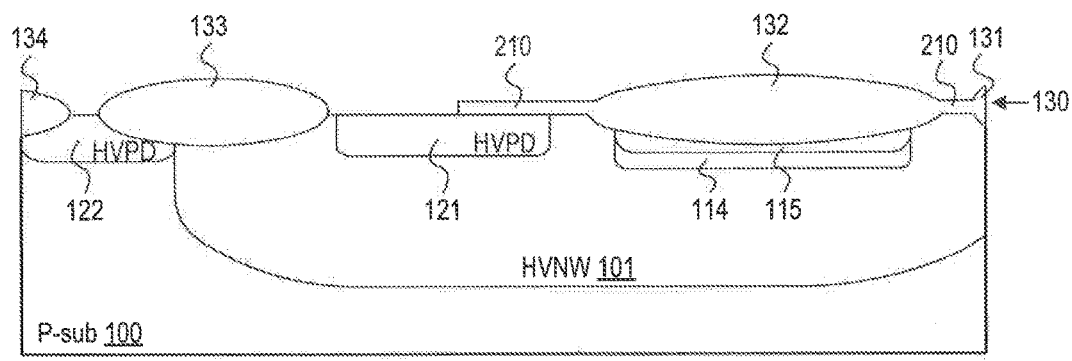
Figure 2H:
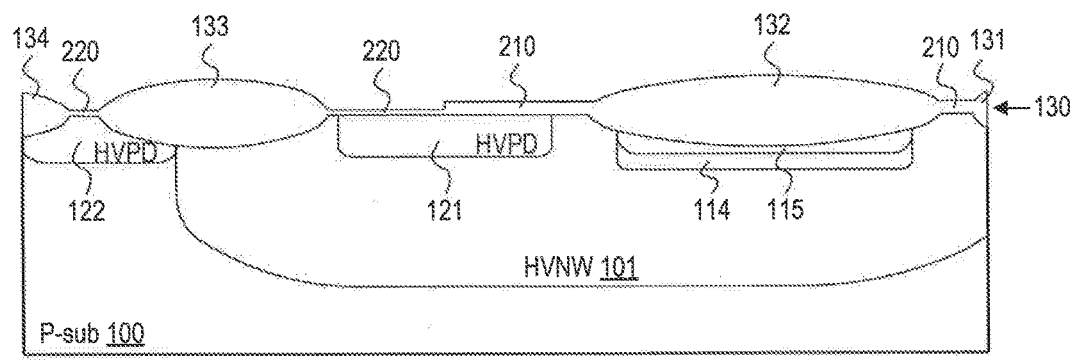
Figure 2I:
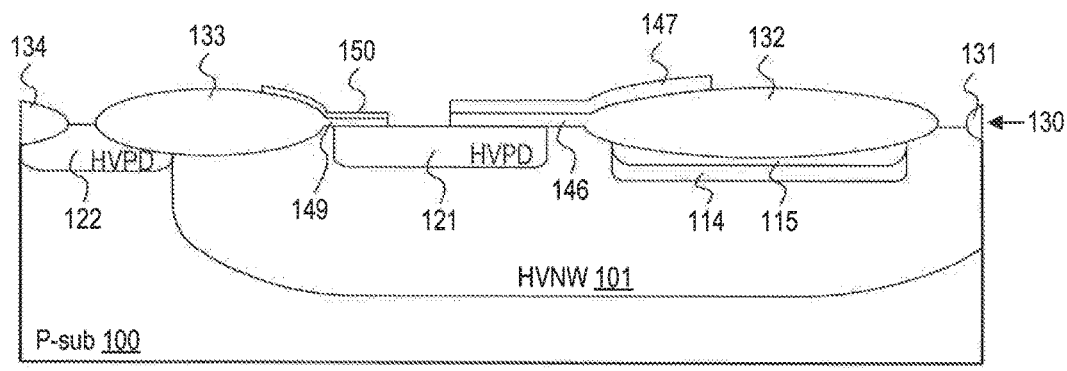
Figure 2J:
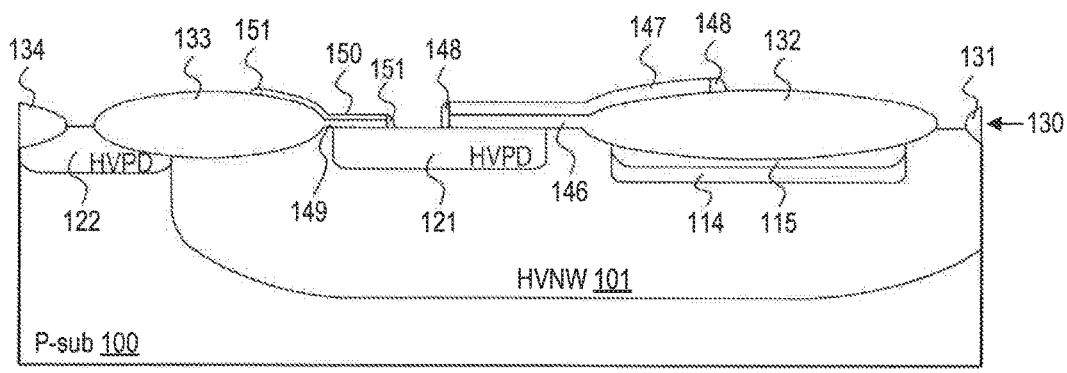
Figure 2K:
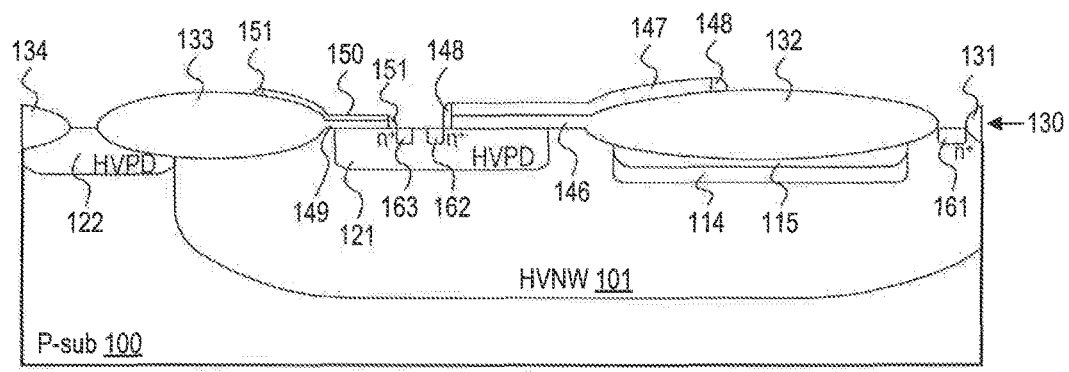
Figure 2L:
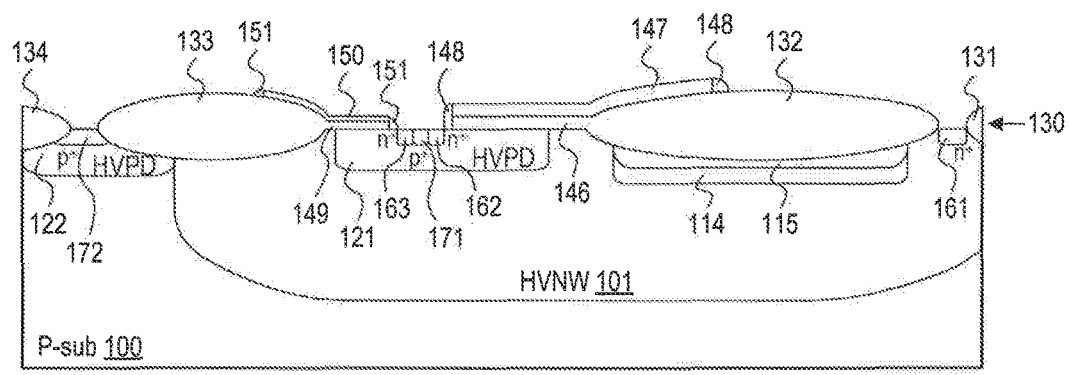
Figure 2M:
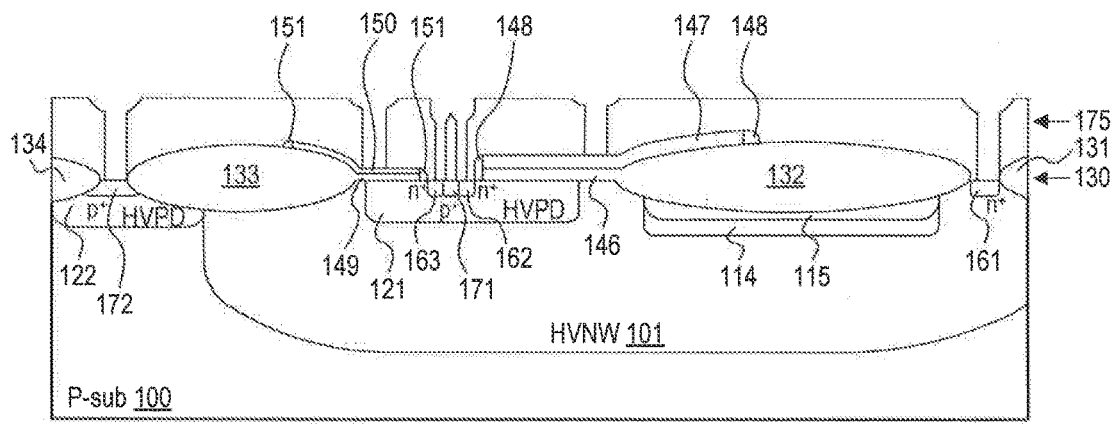
Figure 2N:
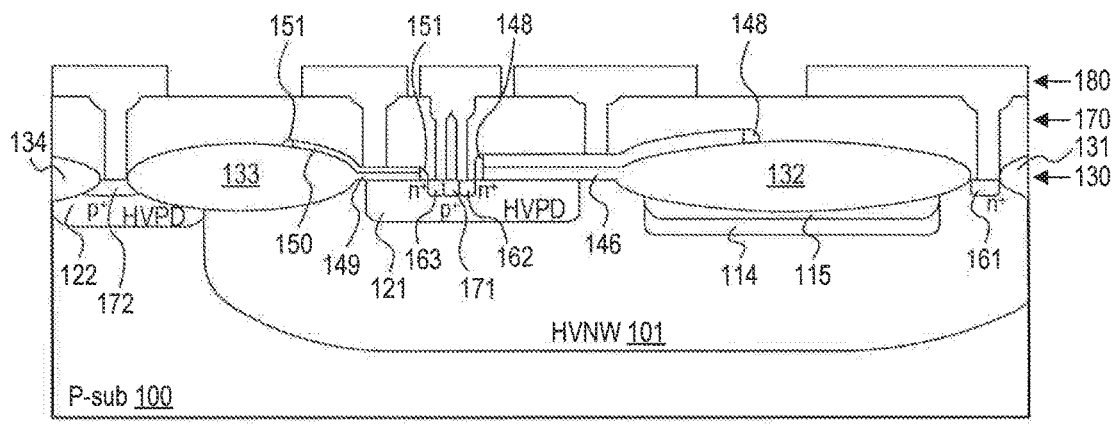

FIGS. 2A-2N schematically illustrate a process for forming region A of device 10 of FIGS. 1A-1C, according to an illustrated embodiment. Region B of device 10 can be formed using a similar process as the process for forming region A. Therefore, detailed description of the process of forming region B of device 10 is omitted.

First, referring to FIG. 2A, substrate 100 is provided. First HVNW 101 is formed in substrate 100 and extends downward from a top surface of substrate 100. For example, first HVNW 101 can be formed by a photolithography process that defines a region in substrate 100 in which first HVNW 101 is to be formed, an ion implantation process for implanting an N-type dopant (e.g., phosphorus or arsenic) at a concentration of about $10^{11}$ to $10^{13}$ atoms/cm$^2$ into the defined region, and a heating process for driving-in the implanted dopant to reach a predetermined depth.

Referring to FIG. 2B, first P-top region 114 is formed in first HVNW 101 to extend downward from a top surface of first HVNW 101. For example, first P-top region 114 can be formed by a photolithography process that defines a region in first HVNW 101 in which first P-top region 114 is to be formed, and an ion implantation process for implanting a P-type dopant (e.g., boron) at a concentration of about $10^{11}$ to $10^{14}$ atoms/cm$^2$ into the defined region.

Referring to FIG. 2C, first N-grade region 115 is formed in first HVNW 101 and above first P-top region 114. First P-top region 114 and first N-grade region 115 together constitute first drift region 111. For example, first N-grade region 115 can be formed by a photolithography process that defines a region in first HVNW 101 in which first N-grade region 115 is to be formed, and an ion implantation process for implanting an N-type dopant (e.g., phosphorus or arsenic) at a concentration of about $10^{11}$ to $10^{14}$ atoms/cm$^2$ into the defined region.

Referring to FIG. 2D, a silicon nitride layer 200 is formed above substrate 100, exposing regions of substrate 100 where FOX layer 130 is to be formed. For example, silicon nitride layer 200 can be formed by a deposition process that deposits silicon nitride over the entire substrate 100, a photolithography process that defines regions of the deposited silicon nitride to be removed, and an etching process that removes the silicon nitride in the defined region.

Referring to FIG. 2E, first HVPD 121 is formed in first HVNW 101, between the left-side edge of first HVNW 101 and first drift region 111. Second HVPD 122 is formed in substrate 100, outside of first HVNW 101, and adjacent to the left-side edge of first HVNW 101. For example, first HVPD 121 and second HVPD 122 are formed by a photolithography process that defines regions in which first HVPD 121 and second HVPD 122 are to be formed, an ion implantation process for implanting a P-type dopant (e.g., boron) at a concentration of about $10^{12}$ to $10^{14}$ atoms/cm$^2$ into the defined regions, and a heating process for driving-in the implanted dopant to reach a predetermined depth.

Referring to FIG. 2F, FOX layer 130 is formed above the structure of FIG. 2E. FOX layer 130 includes first through fourth FOX portions 131-134. For example, FOX layer 130 can be formed by a thermal oxidation process that forms FOX layer 130 in regions of substrate 100 exposed by silicon nitride layer 200.

After forming FOX layer 130, silicon nitride layer 200 is removed. Then, a first oxide layer 210 is formed above regions of substrate 100 exposed by FOX layer 130. For example, first oxide layer 210 can be formed by a sacrificial oxidation process. During the thermal oxidation process for forming FOX layer 130 and the sacrificial oxidation process for forming first oxide layer 210, dopants of first P-top region 114 and first N-grade region 115 are driven to predetermined depths in first HVNW 101.

Referring to FIG. 2G, selected regions of first oxide layer 210 are etched to expose a left-side portion of first HVPD 121, a portion of first HVNW 101 between first HVPD 121 and third FOX portion 133, and a portion of second HVPD 122 between third FOX portion 133 and fourth FOX portion 134.

Referring to FIG. 2H, a second oxide layer 220 is formed above regions of substrate 100 not covered by FOX layer 130 and first oxide layer 210. For example, second oxide layer 220 can be formed by a cleaning process to remove any oxide layers that are formed above the regions of substrate 100 not covered by FOX layer 130 and first oxide layer 210, and an oxidation process to form second oxide layer 220.

Referring to FIG. 2I, first gate layer 147 and second gate layer 150 are formed on substrate 100. First gate layer 147 and second gate layer 150 can include, e.g., a polysilicon layer and a tungsten silicide layer formed above the polysilicon layer. For example, first gate layer 147 and second gate layer 150 can be formed by a deposition process for depositing a polysilicon layer and a tungsten silicide layer over the entire substrate 100, a photolithography process that defines regions where first gate layer 147 and second gate layer 150 are to be formed, and an etching process that removes the polysilicon layer and the tungsten silicide layer outside the defined regions. After forming first gate layer 147 and second gate layer 150, portions of first oxide layer 210 and second oxide layer 220 not covered by first gate layer 147 and second gate layer 150 are removed by etching. The portion of first oxide layer 210 covered by first gate layer 147 constitutes first gate oxide layer 146. The portion of second oxide layer 220 covered by second gate layer 150 constitutes second gate oxide layer 149.

Referring to FIG. 2J, first spacers 148 and second spacers 151 are formed on substrate 100. First and second spacers 148 and 151 are formed of, e.g., tetraethoxysilane (TEOS) oxide films. For example, first and second spacers 148 and 151 are formed by a deposition process that deposits the TEOS oxide film, a photolithography process that defines regions where first and second spacers 148 and 151 are to be formed, and an etching process that removes the TEOS oxide film outside the defined regions.

Referring to FIG. 2K, first through third N$^+$-regions 161-163 are formed in substrate 100. First through third N$^+$-regions 161-163 are formed by a photolithography process that defines regions where first through third N$^+$-regions 161-163 are to be formed, and an ion implantation process for implanting an N-type dopant (e.g., phosphorus or arsenic) at a concentration of about $10^{15}$ to $10^{16}$ atoms/cm$^2$ into the defined regions.

Referring to FIG. 2L, first and second P$^+$-regions 171 and 172 are formed in substrate 100. First P+-region 171 and second P+-region 172 can be formed by a photolithography process that defines regions where first P+-region 171 and second P+-region 172 are to be formed, and an ion implantation process for implanting a P-type dopant (e.g., boron) at a concentration of about $10^{15}$ to $10^{16}$ atoms/cm$^2$ into the defined regions.

Referring to FIG. 2M, ILD layer 175 is formed on the entire surface of the structure of FIG. 2L. ILD layer 175 includes a plurality of through holes. ILD layer 175 can include undoped silicate glass (USG) and/or borophosphosilicate glass (BPSG). For example, ILD layer 175 can be formed by a deposition process for depositing a layer of USG and BPSG, a photolithography process, and an etching process for forming the plurality of through holes.

Referring to FIG. 2N, M1 layer 180 is formed on the structure of FIG. 2M. M1 layer 180 includes first through fifth M1 portions 181-185. M1 layer 180 can be made of metal, such as aluminum, or an aluminum-copper alloy. For example, M1 layer 180 can be formed by a deposition process, a photolithography process, and an etching process.

After forming M1 layer 180, IMD layer 190 and M2 layer 195 are sequentially formed on the structure of FIG. 2N. The processes for forming IMD layer 190 and M2 layer 195 are similar to the processes for forming ILD layer 175 and M1 layer 180. Therefore, a detailed description thereof is not provided.

Figure 3:
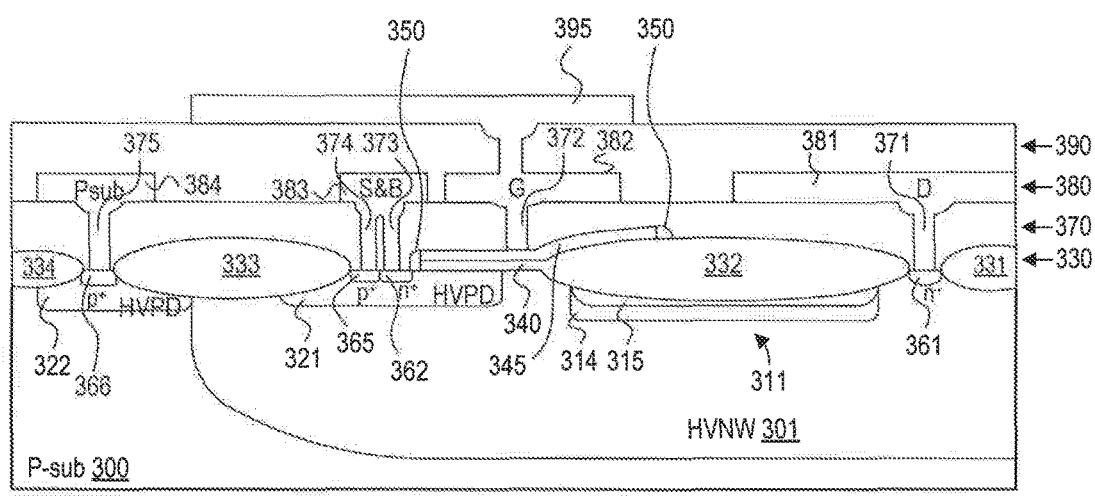
FIG. 3 illustrates a cross-sectional view of a semiconductor device, according to a comparative example.

FIG. 3 illustrates a cross-sectional view of a semiconductor device 30, according to a comparative example. For example, one distinction between device 30 and region A of device 10 is that device 30 includes only one gate structure. Below is an explanation of elements of device 30 that are different from those of device 10.

Referring to FIG. 3, device 30 includes a P-type substrate (P-sub) 300, a HVNW 301 disposed in substrate 300, a drift region 311 including a P-top region 314 and a N-grade region 315 disposed in HVNW 301 and spaced apart from a left-side edge of HVNW 301, a first HVPD 321 disposed in HVNW 301 between the left-side edge of HVNW 301 and drift region 311, and a second HVPD 322 disposed in substrate 300, outside of HVNW 301, and adjacent to the left-side edge of HVNW 301.

A field oxide (FOX) layer 330 is disposed above substrate 300. FOX layer 330 includes a first FOX portion 331 overlapping a right portion of HVNW 301, a second FOX portion 332 overlapping drift region 311, a third FOX portion 333 overlapping a left-side portion of first HVPD 321 and a right-side portion of second HVPD 322, and a fourth FOX portion 334 overlapping a left-side portion of second HVPD 322.

A gate oxide layer 340 is formed above substrate 100, between a right-side portion of first HVPD 321 and second FOX portion 332, and overlaps the right-side portion of first HVPD 321. A gate layer 345 is formed above gate oxide layer 340 and overlaps a left-side portion of second FOX portion 332. That is, gate layer 345 overlaps the left-side portion of second FOX portion 332, a portion of HVNW 301 between first HVPD 321 and second FOX portion 332, and the right-side portion of first HVPD 321. Spacers 350 are formed on both side walls of gate layer 345, and a left-side side wall of gate oxide layer 340. Gate oxide layer 340, gate layer 345, and spacers 350 together constitute a gate structure.

A first N⁺-region 361 is formed in first HVNW 301, between first FOX portion 331 and second FOX portion 332, and spaced apart from a right-side edge of drift region 311. First N⁺-region 361 constitutes a drain region of device 30. A second N⁺-region 362 is formed in first HVPD 321 adjacent to a left-side of spacer 350.

A first P⁺-region 365 is formed in first HVPD 321, adjacent to and between second N⁺-region 362 and third FOX portion 333. Second N⁺-region 362 and first P⁺-region 365 together constitute a source and bulk contact region of device 30. A second P⁺-region 366 is formed in second HVPD 322 and between third FOX portion 333 and fourth FOX portion 334. Second P⁺-region 366 constitutes a contact region for making conductive contact to substrate 300 of device 30.

An interlayer dielectric (ILD) layer 370 is disposed over substrate 300. ILD layer 370 includes a first through hole 371 exposing first N⁺-region 361, a second through hole 372 exposing gate layer 345, a third through hole 373 exposing second N⁺-region 362, a fourth through hole 374 exposing first P⁺-region 365, and a fifth through hole 375 exposing second P⁺-region 366.

A first contact layer 380 provided, for example, as a metal layer, is disposed over ILD layer 370. Hereinafter, first contact layer 380 is referred to as M1 layer 380. M1 layer 380 includes first through fourth M1 portions 381-384 isolated from each other for conductively contacting different portions of the structures formed on substrate 100 via the different through holes formed in ILD layer 370. Specifically, first M1 portion 381 conductively contacts first N⁺-region 361 via first through hole 371, and is connectable to receive a drain voltage. Second M1 portion 382 conductively contacts gate layer 345 via second through hole 372, and is connectable to receive a gate voltage. Third M1 portion 383 conductively contacts second N⁺-region 362 and first P⁺-region 365 via third through hole 373 and fourth through hole 374, respectively, and is connectable to receive a source voltage. Fourth M1 portion 384 conductively contacts second P⁺-region 366, and is connectable to receive a voltage to be applied to substrate 300 of device 30.

An inter-metal dielectric (IMD) layer 390 is disposed over M1 layer 380. IMD layer 390 includes a through hole corresponding to second M1 portion 382.

A second contact layer 395 provided, for example, as a metal layer, is disposed over IMD layer 390. Hereinafter, second contact layer 395 is referred to as M2 layer 395. M2 layer 395 conductively contacts second M1 portion 382.

Figure 4:
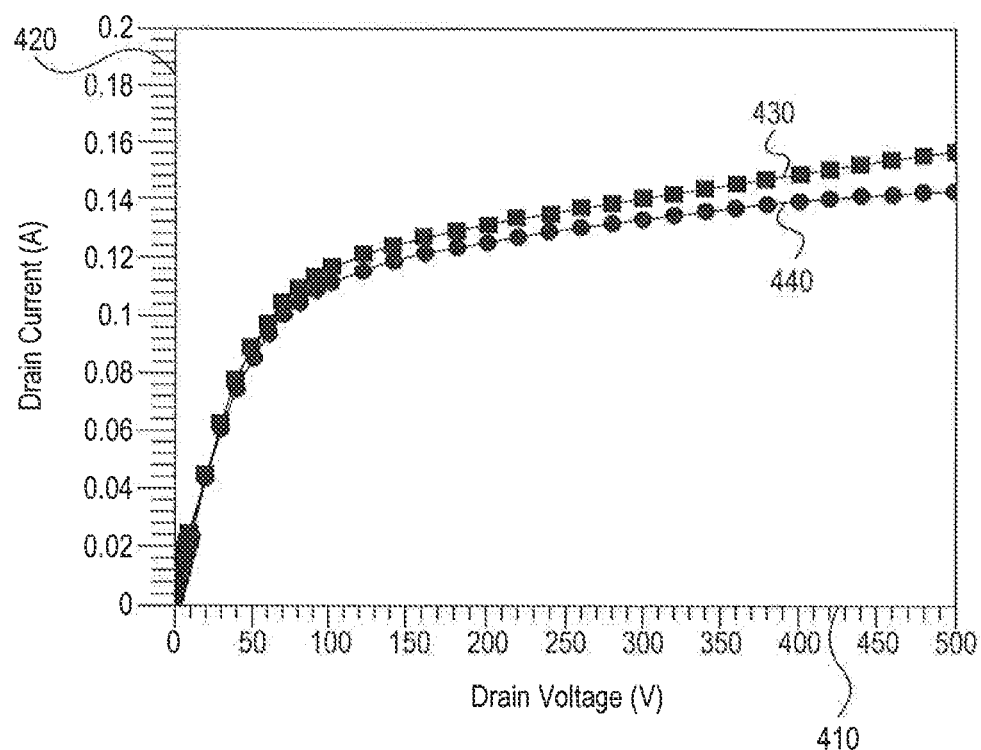
FIG. 4 is a graphical representation of a simulation showing current vs. voltage characteristics of the device of FIGS. 1A-1C according to the illustrated embodiment and the device of FIG. 3 according to the comparative example.

FIG. 4 is a graphical representation of a simulation result showing current vs. voltage characteristics of device 10 according to the illustrate embodiment and device 30 according to the comparative example. In the graph of FIG. 4, abscissa 410 represents a drain voltage (i.e., the voltage applied between first M1 portion 181 and third M1 portion 183 of device 10, or between first M1 portion 381 and third M1 portion 383 of device 30) in volts V, and ordinate 420 represents a drain current (i.e., the current measured between first M1 portion 181 and third M1 portion 183 of device 10, or between first M1 portion 381 and third M1 portion 383 of device 30) in amperes A. Curve 430 represents the current vs. voltage characteristic of device 10. Curve 440 represents the current vs. voltage characteristic of device 30. In the simulation, the drain voltage denoted on abscissa 410 as "Drain Voltage (V)," is increased from 0V to 500V. A gate-source voltage V, (i.e., the voltage applied between second M1 portion 182 and third M1 portion 183 and between fourth M1 portion 184 and third M1 portion 183 in device 10, or between second M1 portion 382 and third M1 portion 383 in device 30) is maintained at 20 V. A bulk-source voltage $V_{bs}$ (i.e., the voltage applied between fifth M1 portion 185 and third M1 portion 183 of device 10, or between fourth M1 portion 384 and third M1 portion 383 of device 30) is maintained at 0V. As illustrated in FIG. 4, when the drain voltage is 500V, the drain current of device 10 is about 9% higher than the drain current of device 30. Accordingly, the specific on-resistance of device 10 is lower by about 9% compared to device 30 when the drain voltage is 500V.

Figure 5:
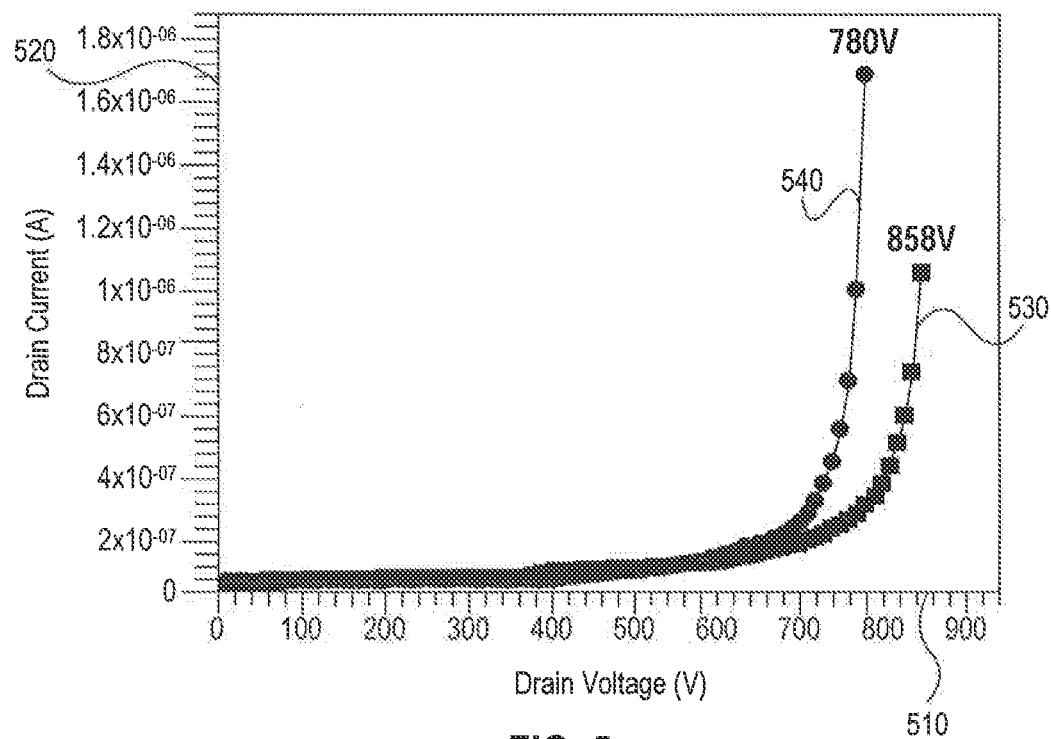
FIG. 5 is a graphical representation of a simulation result showing breakdown characteristics of the device of FIGS. 1A-1C according to the illustrated embodiment and the device of FIG. 3 according to the comparative example.

FIG. 5 is a graphical representation of a simulation result showing breakdown characteristics of device 10 according to the illustrate embodiment and device 30 according to the comparative example. In the graph of FIG. 5, abscissa 510 represents a drain voltage in volts V, and ordinate 520 represents a drain current in amperes A Curve 530 represents the current vs. voltage characteristic of device 10. Curve 540 represents the current vs. voltage characteristic of device 30. In the simulation, the drain voltage denoted on abscissa 510 as "Drain Voltage (V)," is increased from 0V to 900V, and a gate-source voltage $V_{gs}$ and a bulk-source voltage $V_{bs}$ are maintained at 0V. As illustrated in FIG. 5, the off-breakdown voltage of device 10 is about 858V, and the off-breakdown voltage of device 30 is above 780V. Accordingly, the breakdown characteristic of device 10 is similar to that of device 30, and the off-breakdown voltage of device 10 is not materially affected by the addition of the second gate structure.

While the embodiment described with reference to FIGS. 1A-1E is directed to an ultra-high voltage (ultra-HV) NMOS device having a breakdown voltage of about 300V to 1000V, those skilled in the art will now appreciate that the disclosed concepts are equally applicable to P-type MOS (PMOS) devices. Those skilled in the art will also appreciate that the disclosed concepts are applicable to other ultra-HV devices, such as ultra-HV lateral diffused metal-oxide-semiconductor (LDMOS) devices, ultra-HV insulated-gate bipolar transistor (IGBT) devices, and ultra-HV high-voltage diodes.

Figure 6:
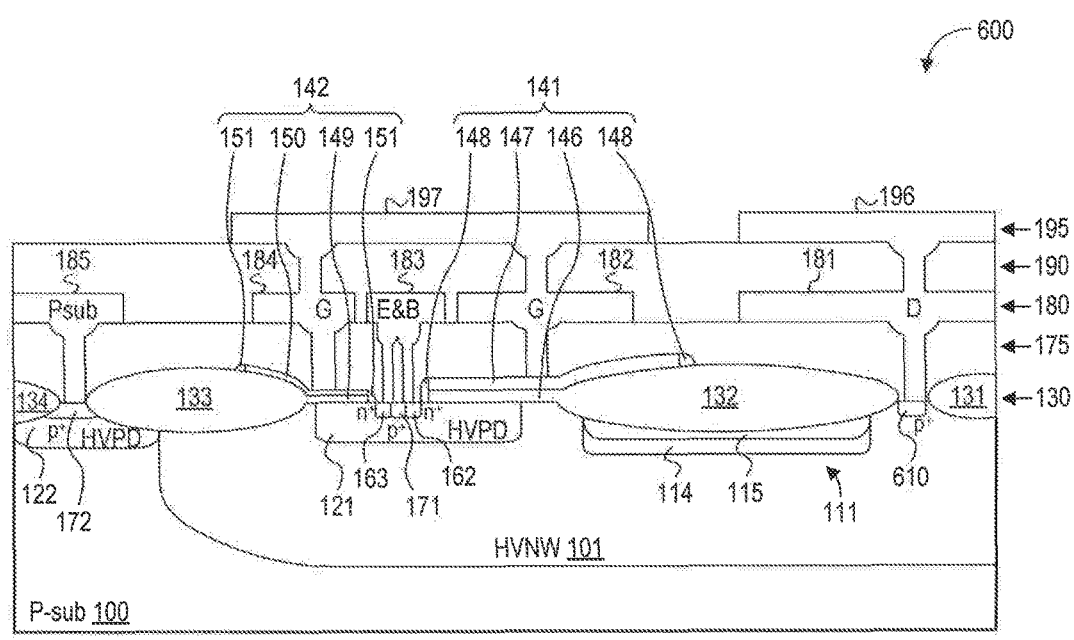
FIG. 6 is a cross-sectional view of an ultra-high voltage (ultra-HV) insulated-gate bipolar transistor (IGBT) device, according to an illustrated embodiment.

FIG. 6 is a cross-sectional view of an ultra-HV IGBT device 600, according to an illustrated embodiment. One distinction between ultra-HV IGBT device 600 and region A of device 10 is that first N⁺-region 161 of device 10 is replaced with a P⁺-region 610. In ultra-HV IGBT device 600 illustrated in FIG. 6, P⁺-region 610 constitutes a collector region (C), first and second gate structures 141 and 142 constitute a base region, while second N⁺-region 162, first P⁺-region 171, and third N⁺-region 163 together constitutes an emitter and bulk contact region (B&E).

Figure 7:
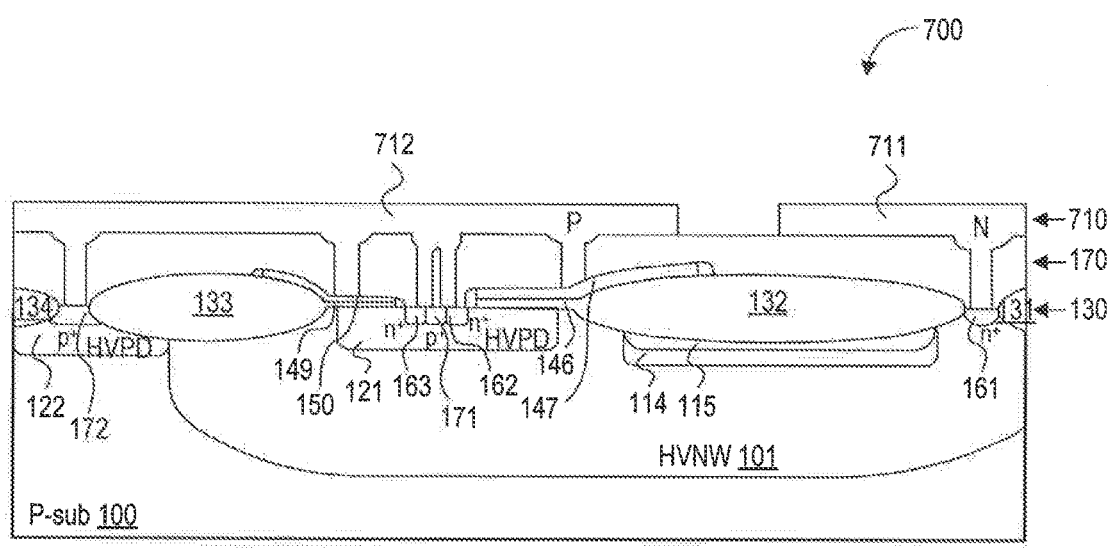
FIG. 7 is a cross-sectional view of an ultra-HV diode, according to an illustrated embodiment.

FIG. 7 is a cross-sectional view of an ultra-HV diode 700, according to an illustrated embodiment. One distinction between ultra-HV diode 700 and region A of device 10 is that M1 layer 180 of device 10 is replaced with an M1 layer 710. M1 layer 710 includes a first M1 portion 711 that conductively contacts first N⁺-region 161, and a second M1 portion 712 that conductively contacts first gate layer 147, second N⁺-region 162, first P⁺-region 171, and third N⁺-region 163, second gate layer 150, and second P⁺-region 172. First M1 portion 711 constitutes an N-type terminal of ultra-HV diode 700, and second M1 portion 712 constitutes a P-type terminal of ultra-HV diode 700.

Figure 8:
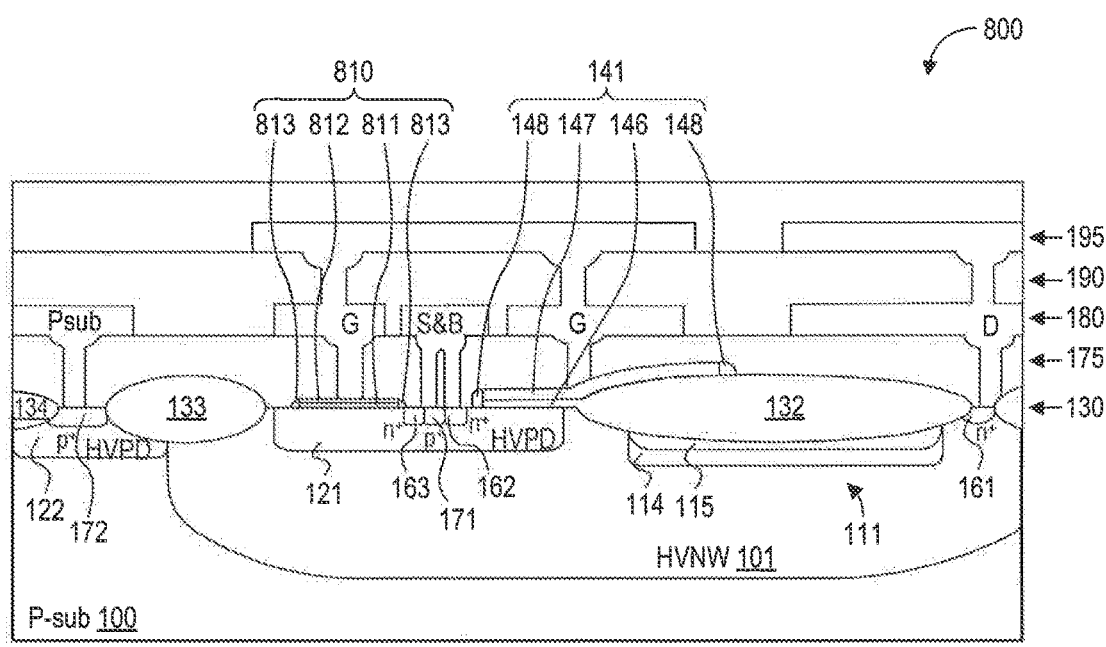
FIG. 8 is a cross-sectional view of a semiconductor device, according to an illustrated embodiment.

FIG. 8 is a cross-sectional view of a semiconductor device 800, according to an illustrated embodiment. One distinction between device 800 and region A of device 10 is that second gate structure 142 of device 10 is replaced with a second gate structure 810. Compared to second gate structure 142, second gate structure 810 only overlaps a left-side portion of first HVPD 121. Second gate structure 810 includes a second gate oxide layer 811, a second ate layer 812, and second spacers 813.

Devices 600, 700, and 800 may each include a structure in a different region which is similar to the structure formed in region B of device 10. One distinction between the structure in the different region and the structures illustrated in FIGS. 6, 7, and 8 is that the structure in the different region include two HVPDs in a HVNW, and a gate structure disposed between the two HVPDs. Detailed description regarding the structure in the different region in each of devices 600, 700, and 800 is omitted.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate having a first conductivity type;
    a high-voltage well having a second conductivity type and disposed in the substrate;
    a high-voltage doped region having the first conductivity type and disposed in the high-voltage well;
    a drain region disposed in the high-voltage well and spaced apart from the high-voltage doped region;
    a source region disposed in the high-voltage doped region;
    a first gate structure disposed above a first side portion of the high-voltage doped region between the source region and the drain region; and
    a second gate structure disposed above a second and opposite side portion of the high-voltage doped region;
    wherein the first gate structure includes a first gate layer and a first gate oxide layer, and the second gate structure includes a second gate layer and a second gate oxide layer,
    the first gate structure including the first gate oxide layer covers an edge portion of a first field oxide portion that overlaps the first side portion of the high-voltage doped region between the source region and the drain region,
    the second gate structure including the second gate oxide layer covers an edge portion of a second field oxide portion that overlaps the second and opposite side portion of the high-voltage doped region, and
    the thickness of the first gate oxide layer being greater than the thickness of the second gate oxide layer.
2. The semiconductor device of claim 1, wherein the first gate structure and the second gate structure are electrically connectable to receive a gate voltage.
3. The semiconductor device of claim 1, wherein the first gate structure is further disposed above a portion of the high-voltage well, outside of the high-voltage doped region and adjacent to the first side portion of the high-voltage doped region.
4. The semiconductor device of claim 1, wherein the second gate structure is further disposed above a portion of the high-voltage well, outside of the high-voltage doped region and adjacent to the second side portion of the high-voltage doped region.
5. The semiconductor device of claim 1, wherein the second gate structure is disposed only above the second side portion of the high-voltage doped region.
6. The semiconductor device of claim 1, further including a drift region disposed in the high-voltage well between the high-voltage doped region and the drain region, and spaced apart from the high-voltage doped region and the drain region.
7. The semiconductor device of claim 6, wherein the drift region includes:
    a top region having the first conductivity type and disposed in the high-voltage well; and
    a grade region having the second conductivity type and disposed above the top region.
8. The semiconductor device of claim 1, wherein the source region includes:
    a first heavily doped region having the second conductivity type;
    a second heavily doped region having the second conductivity type and spaced apart from the first heavily doped region; and
    a third heavily doped region having the first conductivity type and disposed between the first heavily doped region and the second heavily doped region.
9. The semiconductor device of claim 1, wherein the semiconductor device is a metal oxide semiconductor (MOS) device,
    the drain region including a heavily doped region having the second conductivity type.
10. The semiconductor device of claim 1, wherein the semiconductor device is an insulated gate bipolar transistor,
    the insulated gate bipolar transistor including a collector region formed of a heavily doped region having the first conductivity type.
11. The semiconductor device of claim 1, wherein the semiconductor device is a diode.
12. The semiconductor device of claim 1, wherein the first conductivity type is P-type and the second conductivity type is N-type.
13. The semiconductor device of claim 1, wherein the first conductivity type is N-type and the second conductivity type is P-type.
14. A method for manufacturing a semiconductor device, comprising:
    providing a substrate having a first conductivity type;
    forming a high-voltage well having a second conductivity type in the substrate;
    forming a high-voltage doped region having the first conductivity type in the high-voltage well;
    forming a drain region in the high-voltage well and spaced apart from the high-voltage doped region;
    forming a source region in the high-voltage doped region;
    forming a first gate structure above a first side portion of the high-voltage doped region between the source region and the drain region; and
    forming a second gate structure above a second and opposite side portion of the high-voltage doped region;
    wherein forming the first gate structure includes forming a first gate layer and a first gate oxide layer to cover an edge portion of a first field oxide portion that overlaps the first side portion of the high-voltage doped region between the source region and the drain region,
    forming the second gate structure includes forming a second gate layer and a second gate oxide layer to cover an edge portion of a second field oxide portion that overlaps the second and opposite side portion of the high-voltage doped region, and the thickness of the first gate oxide layer is greater than the thickness of the second gate oxide layer.

15. The method of claim 14, further including providing electrical contacts for electrically connecting the first gate structure and the second gate structure.

16. The method of claim 14, wherein forming the first gate structure further includes:

forming the first gate structure above a portion of the high-voltage well, outside of the high-voltage doped region and adjacent to the first side portion.

17. The method of claim 14, wherein forming the second gate structure further includes:

forming the second gate structure above a portion of the high-voltage well, outside of the high-voltage doped region and adjacent to the second side portion of the high-voltage doped region.

18. The method of claim 14, wherein forming the second gate structure further includes:

forming the second gate structure only above the second side portion of the high-voltage doped region.

19. The method of claim 14, further including:

forming a drift region in the high-voltage well between the high-voltage doped region and the drain region, and spaced apart from the high-voltage doped region and the drain region.

* * * * *